United States Patent
Chang et al.

(10) Patent No.: US 6,679,064 B2
(45) Date of Patent: Jan. 20, 2004

(54) WAFER TRANSFER SYSTEM WITH TEMPERATURE CONTROL APPARATUS

(75) Inventors: Chih-Wei Chang, Hsin-Chu (TW); Fa-Yuan Chang, Taipei (TW); Cheng-Ting Tseng, Hsin-Chu (TW); Chin-Chang Chen, Shinjuang (TW); Cheng-Cheng Chang, Hsin-Chu (TW); Shih-Fang Chen, Sanchung Taipei (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/144,521

(22) Filed: May 13, 2002

(65) Prior Publication Data

US 2003/0209014 A1 Nov. 13, 2003

(51) Int. Cl.[7] .......................... F25B 21/02; H01L 35/34
(52) U.S. Cl. .......................................... 62/3.3; 136/201
(58) Field of Search ............................ 62/3.3, 3.1, 3.2, 62/3.7; 136/201, 203; 361/688, 704; 165/80.2

(56) References Cited

U.S. PATENT DOCUMENTS

| | | | | |
|---|---|---|---|---|
| 5,297,910 A | * | 3/1994 | Yoshioka et al. | 414/226.01 |
| 5,817,188 A | * | 10/1998 | Yahatz et al. | 136/201 |
| 6,199,927 B1 | * | 3/2001 | Shamlou et al. | 294/64.1 |
| 6,322,626 B1 | * | 11/2001 | Shirley | 118/73 |
| 6,334,311 B1 | * | 1/2002 | Kim et al. | 62/3.2 |
| 6,521,991 B1 | * | 2/2003 | Yamada et al. | 257/712 |

* cited by examiner

Primary Examiner—Chen Wen Jiang
(74) Attorney, Agent, or Firm—Tung & Associates

(57) ABSTRACT

A wafer transfer system having a temperature control apparatus. The temperature control apparatus is constructed and arranged so that a material, element, or atomic particle may flow therethrough to heat or cool a wafer carried by the wafer transfer system. The material, element or atomic particle flowing through the temperature control apparatus causes heat to be pumped to or from an upper surface or lower surface. Preferably the temperature control apparatus is a thermoelectric device. Preferably the thermoelectric device includes a plurality of alternating N-type and P-type semiconductor pellets arranged electrically in series and thermally in parallel, and connected to a DC power supply. A switch or relay is provided for altering the direction of current flow to the thermoelectric device from a DC supply.

19 Claims, 4 Drawing Sheets

WAFER TRANSFER SYSTEM WITH TEMPERATURE CONTROL APPARATUS

FIELD OF THE INVENTION

This invention relates to a wafer transfer system, and more particularly to a wafer transfer system with a temperature control apparatus for controlling the temperature of the wafer.

BACKGROUND OF THE INVENTION

In 1821 Thomas Seebeck discovered that an electric circuit would flow continuously in a closed circuit made up of two dissimilar metals (conductors) if the junctions of the metals (conductors) or maintained at two different temperatures. In 1834, a French watch maker and part-time physicist Jean Peltier discovered that an electrical circuit would produce a temperature gradient at the junction of two dissimilar metals (conductors). Stated another way, Peltier discovered that passing current through two dissimilar electrical conductors caused heat to be either emitted or absorbed at the junctions of the conductors. Twenty years later Thomas (Lord Calvin) issued a comprehensive explanation of the Seebech and Peltier Effects and described their interrelationship.

It was only after the mid $20^{th}$-Century advancements in semiconductor technology that practical applications for thermoelectric devices became feasible. With such modern techniques, thermoelectric modules can be produced that deliver efficient solid state heat pumping for both cooling and heating. Many of these thermoelectric modules or units can be used to generate DC power in certain circumstances (that is conversion of waste heat).

A detailed description of the thermoelectric technologies can be found at http://www.naijiw.com/peltier/peltier. The following description of thermoelectric technology, components and uses is derived from or is a restatement of the disclosure that appears at the above web site.

The Peltier Effect occurs whenever electrical current flows through two dissimilar conductors. Dependent upon the direction to current flow, the junction of the conductors will either absorbed or release heat. Today, semiconductors, usually bismuth telluride, are the materials of choice for producing the Peltier Effect. The semiconductor materials can be more easily optimized for heat pumping, and designers can control the type of charge carrier employed within the conductor as will be described hereafter. Using this type of material a Peltier device for thermoelectric modules can be constructed.

FIG. 1 illustrates a basic thermoelectric module 10 useful in the present invention. A thermoelectric module 10 includes at least a single pellet or structure 12 of an electrically conductive material which is secured by solder (not shown) to an electrically conductive material 14 (usually plated copper) at each end of the pellet 12. In this most simplistic configuration, the second dissimilar material (metal) required for the Peltier effect is actually the copper connection paths 16 to the power supply 18. In this configuration, heat will be moved or pumped in the direction of the charge carrier movement throughout the circuit. It is actually the charge carriers that transfer this heat. For example, when a "N-type" semiconductor material is used for the pellet 12, the pellet includes electrons (with a negative charge, usually due to the addition of P atoms into the base semiconductor material) that will be the charge carriers utilized to create the transfer of heat. With a DC voltage source 18 connected as shown, electrons will be repelled by he negative pole and attracted by the positive pole of the a DC voltage supply 18. This produces electron flow in a clock wise direction. With electrons flowing through the N-type material of the pellet 12 from the bottom 20 to the top 22 of the pellet 12 so that heat is absorbed at the bottom junction 24 (top surface of plated copper 14) and pumped by the charge carriers through the semiconductor pellet 12 to be dissipating at the top junction 26 (bottom surface of plated copper 14).

FIG. 2 illustrates another embodiment of a thermoelectric device useful in the present invention. In this embodiment, and "P-type" semiconductor pellets 12' are utilized. The P-type pellets are manufactured so that the charge carriers in the material are positive, also known electronics as "holes". These "holes" are typically created by the addition of B atoms into the base semiconductor material. The "holes" allow electrons to flow through the material when a voltage is applied. These positive charge carriers are repelled by the positive pole of the DC voltage supply 18 and attracted by the negative pole. The "hole" flow is in the opposite direction of the electron flow. The "holes" flow from the top 22 of the P-type pellet 12' to the bottom 20 of the pellet 12'. The use of P-type materials results in heat being drawn toward the negative pole of the power supply 18 and away from the positive pole of the power supply 18. Thus, heat is absorbed at the junction 26 (top surface of plated copper 14) travels through the pellet 12' and is dissipating at junction 24 (bottom surface of plated copper 14). In this embodiment, the direction of flow of the "holes" and the heat is in a counter clock wise direction. However, single pellet embodiments of thermoelectric devices as shown in FIGS. 1–2 are not sufficient to remove a substantial quantity of heat and therefore more complicated structures are required.

FIG. 3 illustrates another embodiment of a thermoelectric device 10 useful in the present invention. In this embodiment the thermoelectric device 10 includes a plurality of pellets 12 (N-type) arranged both electrically and thermally in parallel. This arrangement produces a greater amount of heat simply because there are more pellets 12. However, there is a problem with this type of arrangement in that each pellet 12 is typically rated for only a small voltage, often less than 10 millivolts but draws a substantial amount of current. A single pellet in a typical thermoelectric device might draw 5 A or more with only 60 millivolt supplied. When a number of such pellets are arranged in parallel, the current draw typically becomes impractical.

FIG. 4 illustrates another embodiment of a thermoelectric device useful in the present invention. In this embodiment, a number of N-type pellets 12 are arranged thermally in parallel but electrically in series. To accomplish this, electrical connection 28 is provided and connected at one end at the plated copper 14 near the top 22 of the pellet 12 and connected at the other end to the plated copper 14 at the bottom 20 at the next adjacent positioned pellet 12. Although this arrangement is plausible, electrical shorts may occur between pellets.

FIG. 5 illustrates another embodiment of the thermoelectric device 10 useful in the present invention. In this embodiment, a N-type electrically conductive material 12 and a spaced apart P-type electrically conductive material 12' are arranged to form a junction between them with a plated copper pad 14. This arrangement allows the electrically conductive materials 12, 12' to be arranged electrically in series and thermally in parallel. In this embodiment negative charge carriers in the N-type material or pellet 12 flow from the bottom 20 of the pellet 12 to the top 22 of the pellet 12. Likewise, the heat flows in the same direction through the N-type pellet. The positive charge carriers or "holes" flow from the bottom 20 of the P-type material or pellet 12' to the top 22 of the P-type pellet 12'. Likewise the heat flows in the same direction as the "holes" flow through the P-type pellet 12'. In this arrangement the electrons flow continuously from the negative pole of the voltage supply, through the N-type pellet 12, through the copper plated junction 14, through the P-type pellet 12' and back to the positive pole of the supply 18.

FIG. 6 illustrates another embodiment of a thermoelectric device 10 useful in the present invention. In this embodiment, a plurality of N-type and P-type pellet couples 12, 12' are connected together electrically in series and thermally in parallel as described with respect to FIG. 5. Each coupling of pellets 12, 12' operates in the same fashion as the thermoelectric device 10 described in FIG. 5. This arrangement allows the pellets to be mechanically connected together by the plated copper tabs 14, preferably in rectangular arrays to create practical thermoelectric modules. This arrangement allows for the thermoelectric device 10 to pump appreciable amounts of heat and the series electrical connection is suitable for commonly available DC power supplies. A typical thermoelectric device 10 arranged in this fashion can connect 254 alternating P-type and N-type pellets and can be run from a 12–16 VDC supply and draws only 4–5 A.

FIG. 7 is a schematic illustration of a DPDT relay wired in a classic polarity-reversal configuration, and can be utilized to reverse the current flow from the DC supply to anyone of the thermoelectric devices 10 described above in order to change the direction of the heat flow through the thermoelectric device 10. A similar switching arrangement might be accomplished by a transistor bridge using MOSFETs.

FIG. 8 is an exploded view of a thermoelectric device 10 with alternating P-type and N-type pellets 12', 12 arranged electrically in series but thermally in parallel as described in FIG. 6. The alternating pellets 12', 12 are sandwiched between ceramic substrates 30 to provide a thermoelectric device 10 or module. The ceramic substrates 30 may be attached to each other or to the alternating pellets 12', 12 using mechanical means or thermal adhesives. All of the above described thermoelectric devices 10 are useful in the present invention as will be described hereafter.

SUMMARY OF THE INVENTION

One embodiment of the invention includes a semiconductor wafer transfer system including a wafer blade and a thermal control apparatus supported by the wafer blade. The thermal control apparatus includes an upper surface and lower surface. The thermal control apparatus is constructed and arranged to pump heat from one of the surfaces to the other.

Another embodiment of the invention includes a semiconductor wafer transfer system including a wafer blade and a thermoelectric device supported by the wafer blade. The thermal electric device includes an upper surface and a lower surface. The thermoelectric device is constructed and arranged to pump heat from one of the surfaces to the other.

Another embodiment of the invention includes a semiconductor wafer transfer system including a wafer blade and a thermoelectric device wherein the thermoelectric device includes a plurality of alternating N-type and P-type semiconductor structures connected together electrically in series and thermally in parallel.

Another embodiment of the invention includes a semiconductor wafer transfer system including a wafer blade and the thermoelectric device, wherein the wafer blade includes a base portion and a pair of spaced apart side rails extending outwardly from the base portion. The side rails are constructed and arranged to support the thermoelectric device.

Another embodiment of the invention includes an end rail bridging the pair of spaced apart side rails. The end rail includes a ledge for supporting the thermoelectric device.

Another embodiment of the invention includes a semiconductor wafer transfer system wherein the thermoelectric device includes sides, and further including at least one abutment structure on the end rail constructed and arranged to engage a side of the thermoelectric device.

Another embodiment of the invention includes a semiconductor wafer transfer system wherein each abutment is slidable attached to the end rail and movable to a position to clamp against the thermoelectric device.

Another embodiment of the invention includes a semiconductor wafer transfer system wherein the thermoelectric device includes sides, and further including a pair of spaced apart abutment structures on the end rail. Each abutment structure is constructed and arranged to engage a side of the thermoelectric device.

Another embodiment of the invention includes a semiconductor wafer transfer system including a wafer blade and a thermoelectric device. The wafer blade includes a base portion having a ledge formed therein for supporting a portion of the thermoelectric device. The thermoelectric device further includes sides. The base portion also includes an abutment wall formed therein adjacent the ledge for engaging the side of thermoelectric device.

Another embodiment of the invention includes a semiconductor wafer transfer system including a wafer blade and a thermoelectric device and also a DC voltage supply electrically connected to the thermoelectric device.

Another embodiment of the invention includes a semiconductor wafer transfer system further including a controller connected to the DC voltage supply to turn the current on or off, and to switch the polarity of the DC voltage supply in response to input signals from sensors in the thermoelectric device.

Another embodiment of the invention includes a semiconductor wafer transfer system further including a controller connected to the DC voltage supply to switch the polarity of the DC voltage supply to the thermoelectric device thereby altering the flow direction of heat being pumped through the thermoelectric device.

Another embodiment of the invention includes a semiconductor wafer transfer system including a wafer blade and a thermoelectric device, and wherein the wafer blade further includes a base portion and a pair of spaced apart side rails extending from the base portion to define an opening between the side rails. The thermoelectric device is supported by the side rails. A heat shield is connected to and extends between the side rails and underlies the thermoelectric device.

Another embodiment of the invention includes a semiconductor wafer transfer system including a wafer blade and a thermoelectric device, and wherein the wafer blade further includes a base portion and electrical leads extending outwardly from the base portion for connecting to the thermoelectric device.

Another embodiment of the invention includes a semiconductor wafer transfer system further including a DC voltage supply electrically connected to the electrical leads extending outwardly from the base portion.

Another embodiment of the invention includes a semiconductor wafer transfer system including a wafer blade and a thermoelectric device, and wherein the thermoelectric device includes a plurality of one of N-type and P-type semiconductor structures connected together electrically in series and thermally in parallel.

Another embodiment of the invention includes a semiconductor wafer transfer system including a wafer blade and a thermoelectric device supported by the wafer blade. The thermoelectric device includes a plurality of alternating N-type and P-type semiconductor structures connected together electrically in series and thermally in parallel. Each N-type and P-type semiconductor structure includes a top surface and a bottom surface. An electrically and thermally conductive material connects the top surfaces of the pair of adjacent N-type and P-type semiconductor structures. Another electrically and thermally conductive material connects the bottom surfaces of a second pair of adjacent N-type and P-type semiconductor structures so that the N-type and P-type structures are connected electrically in series.

Another embodiment of the invention includes a semiconductor wafer transfer system including a wafer blade and a thermoelectric device supported by the wafer blade, and wherein the thermoelectric device also includes a pair of ceramic substrates. A plurality of semiconductor structures are sandwiched between the ceramic substrates.

Another embodiment of the invention includes a semiconductor wafer transfer system including a wafer blade and the thermal electric device supported by the wafer blade and also including a robot arm connected to the wafer blade.

Another embodiment of the invention includes a semiconductor wafer transfer system including a wafer blade and a thermoelectric device. The thermoelectric device includes a plurality of alternating N-type and P-type semiconductor structures electrically connected in series and thermally connected in parallel. Each of the semiconductor structures has a top surface and a bottom surface, and the thermoelectric device is constructed and arranged so that direct current flowing through the thermoelectric device will cause heat to be pumped from the top surface to the bottom surface, or from the bottom surface to the top surface depending upon the direction the electrons flow through the thermoelectric device. The wafer blade also includes a base portion and a pair of spaced apart side rails extending therefrom. The thermoelectric device is supported by the side rails.

These and other objects, features, and advantages of the present invention will be apparent from the following brief description of the drawings, detailed description of the preferred embodiments and appended claims and drawings.

DETAILED DESCRIPTION OF THE PREFERRED EMBODIMENTS

In the manufacture of semiconductor wafers it is typical to provide a wafer transfer system to move the semiconductor wafer from one process station or storage station to another. It is also typical in the manufacture semiconductor wafers to heat or cool the wafer immediately after the wafer undergoes a semiconductor processing step. The heating or cooling of the wafer between major semiconductor processing steps usually requires additional hot plates or cooling chambers that add to the complexity and cost of manufacturing the semiconductor wafer. The present invention provides a unique apparatus for transferring wafers, and at the same time can heat or cool the wafer between major semiconductor processing steps.

Figure 1:
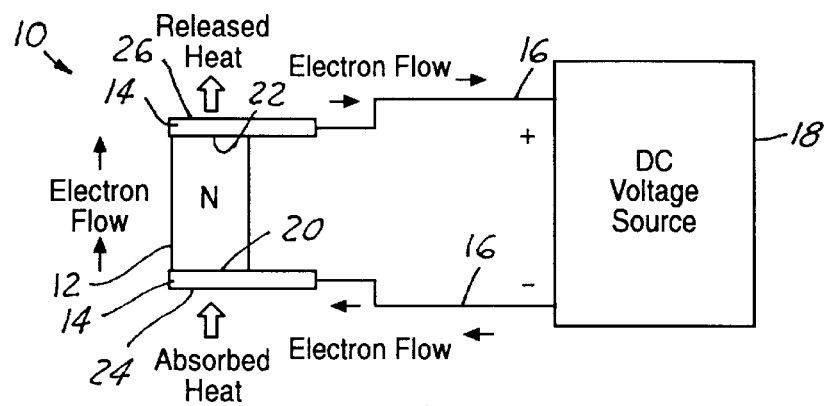
FIG. 1 illustrates a N-type single pellet thermoelectric device useful in the present invention.
Figure 2:
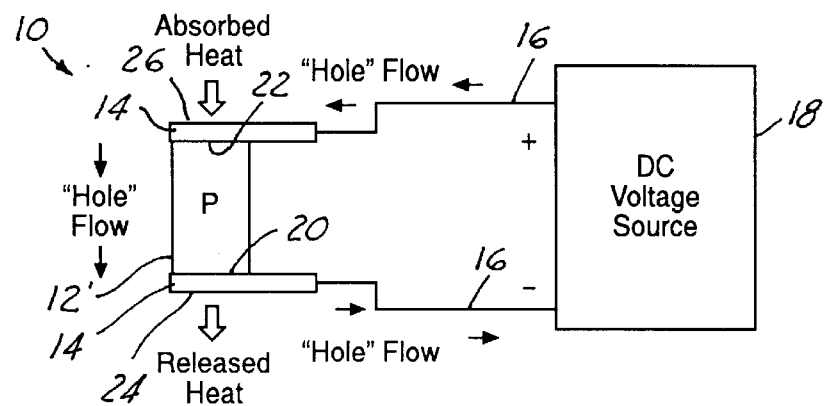
FIG. 2 illustrates a P-type single pellet thermoelectric device useful in the present invention.
Figure 3:
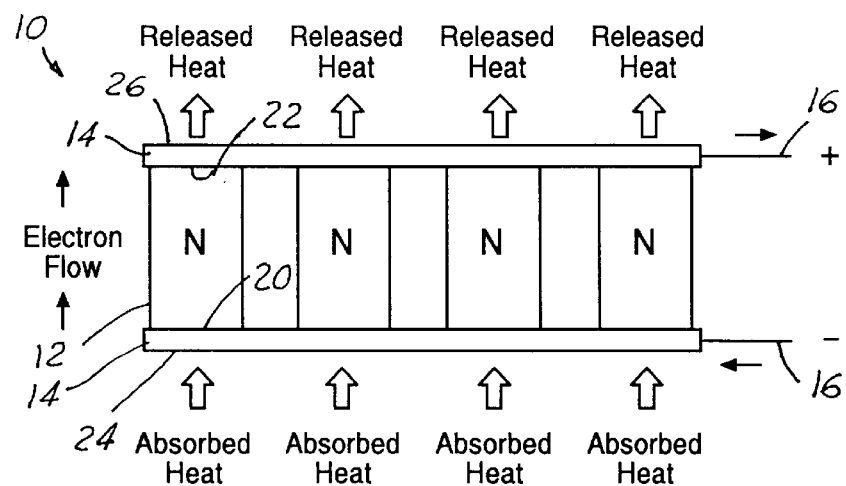
FIG. 3 illustrates a thermoelectric device having a plurality of N-type pellets arranged electrically and thermally in parallel that is useful in the present invention.
Figure 4:
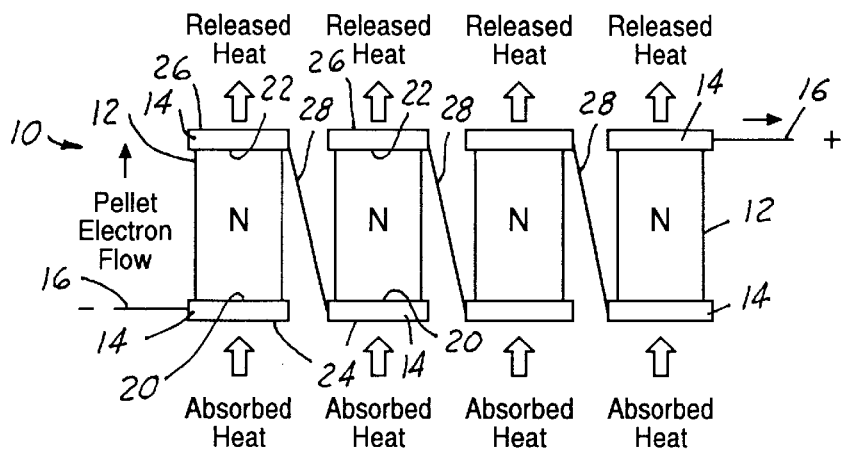
FIG. 4 illustrates a thermoelectric device with the plurality of N-type pellets arranged electrically in series and thermally in parallel that is useful in the present invention.
Figure 5:
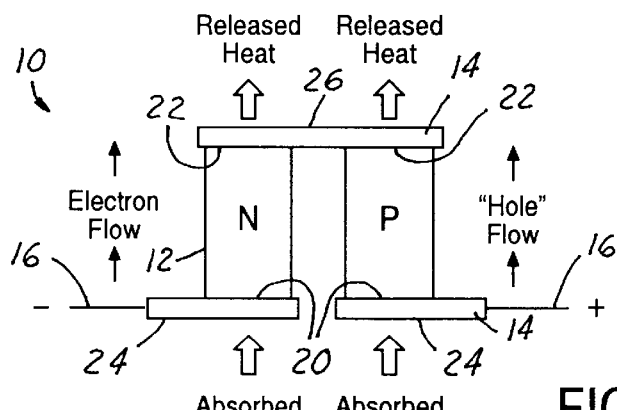
FIG. 5 illustrates a thermoelectric device having a N-type and P-type pellet coupling arranged electrically in series and thermally in parallel that is useful in the present invention.
Figure 6:
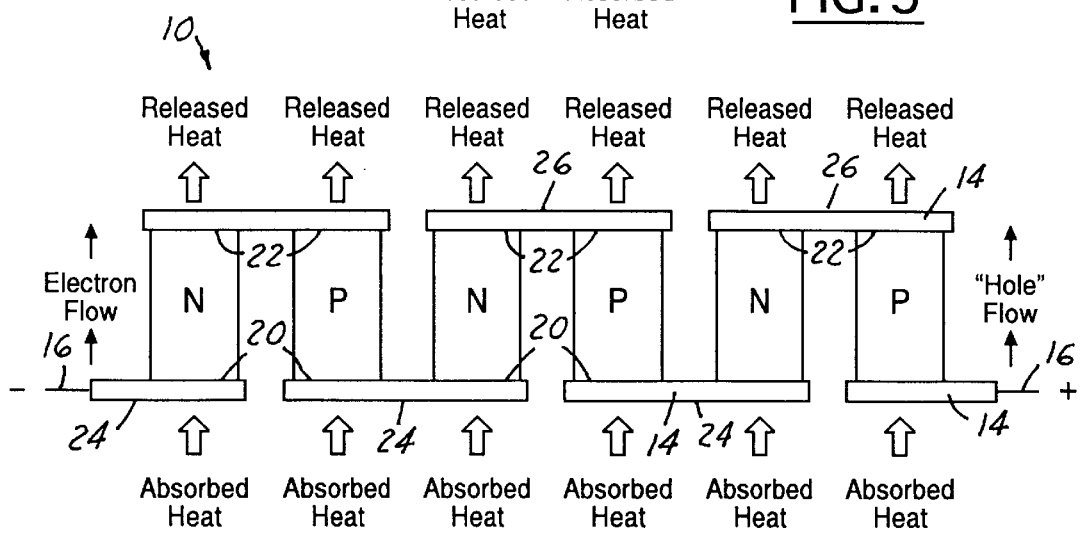
FIG. 6 illustrates a thermoelectric device having a plurality of alternating N-type and P-type pellets arranged electrically in series and thermally in parallel that is useful in the present invention.
Figure 7:
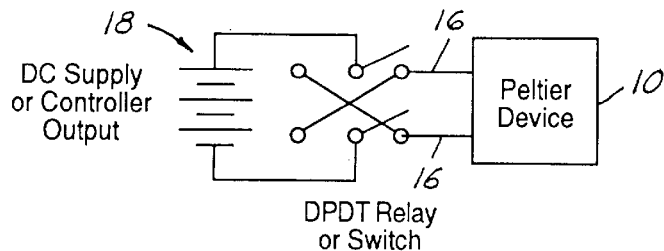
FIG. 7 is a schematic illustration of a relay or switch for a changing the direction of the current from a DC supply to a thermoelectric device useful in the present invention.
Figure 8:
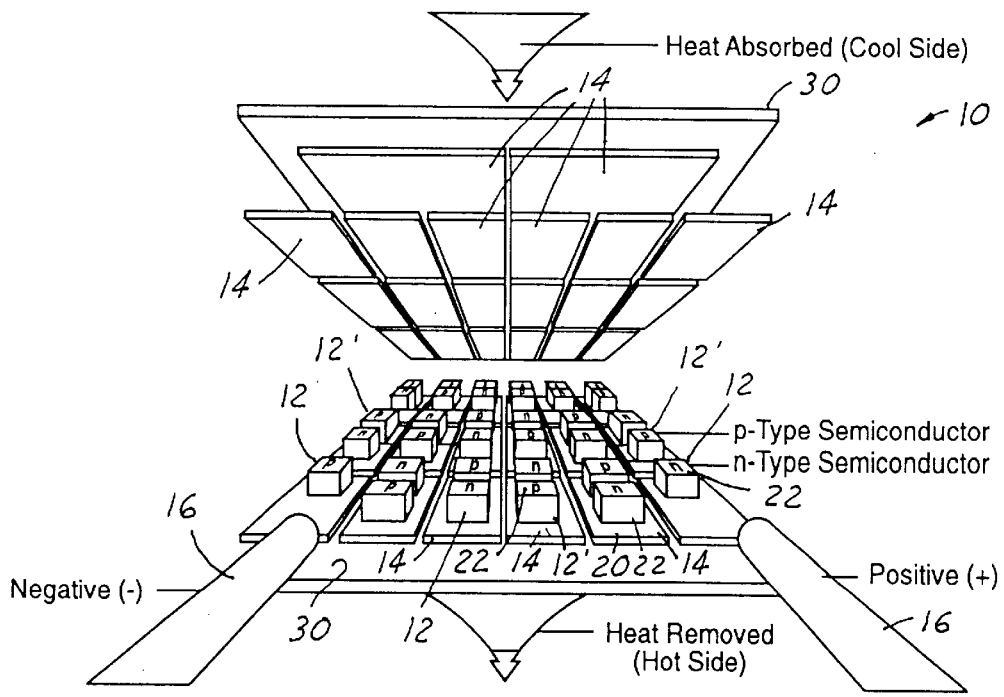
FIG. 8 is an exploded view of a thermoelectric device useful in the present invention.
Figure 9:
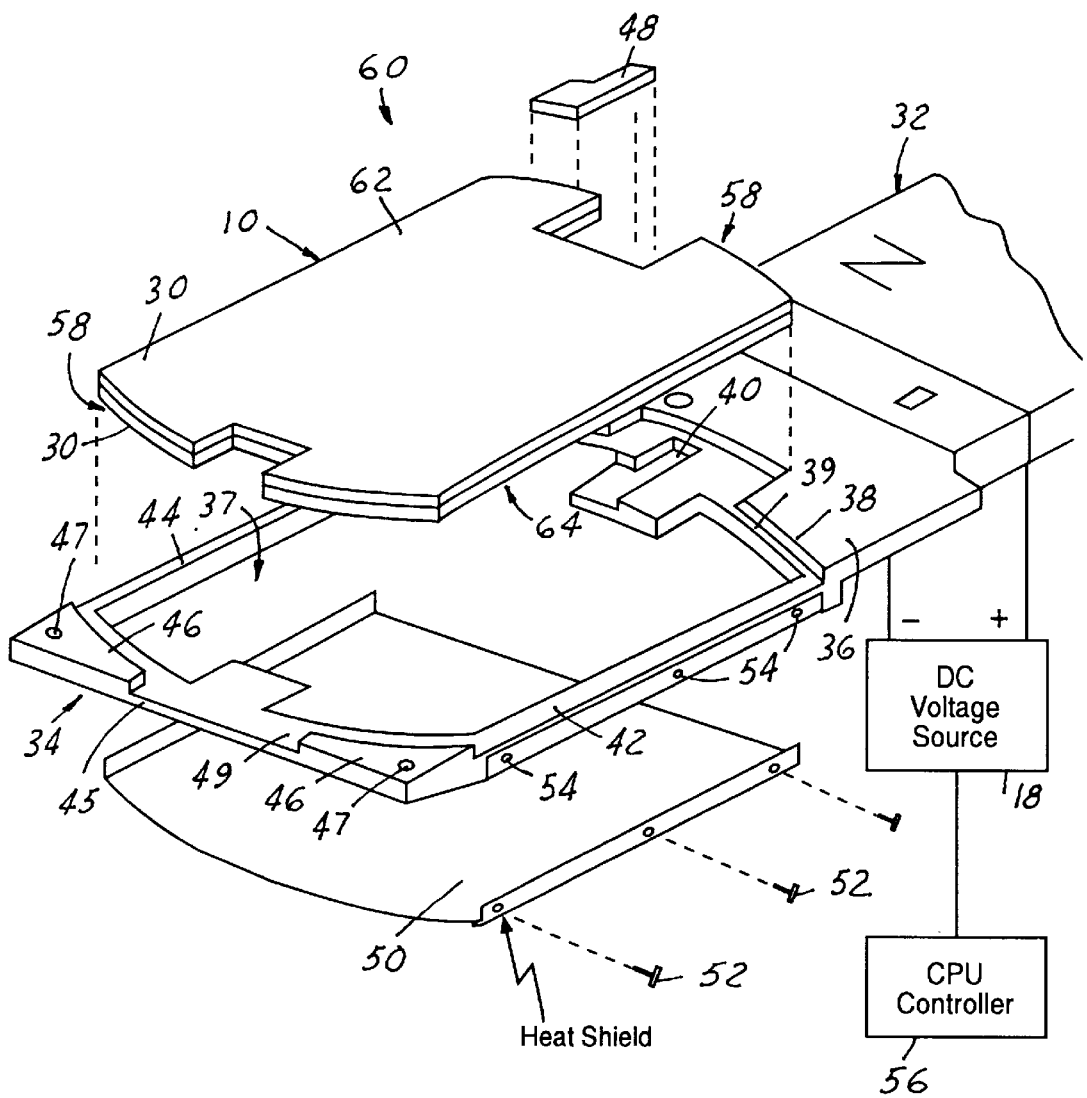
FIG. 9 is a wafer transfer system having a temperature control apparatus, such as a thermoelectric device for heating or cooling a wafer carried by the wafer transfer system according to the present invention.

FIG. 9 is an exploded view illustrating a wafer transfer system 60 according to the present invention having a temperature control apparatus 10. The temperature control apparatus 10 is constructed and arranged so that a material, element, or atomic particle may flow therethrough to heat or cool a wafer carried by the wafer transfer system 16. The material, element or atomic particle flowing through the temperature control apparatus 10 causes heat to be pumped to or from an upper surface 62 or lower surface 64 of the temperature control apparatus 10. Preferably the temperature control apparatus is a thermoelectric device 10, including anyone of the thermoelectric devices described in the background of the invention. Preferably the thermoelectric device 10 is of the type illustrated in FIG. 8 of the background of the invention. More specifically, the device 10 illustrated in FIG. 8 is constructed and a similar fashion with respect to the thermoelectric device 10 shown in FIG. 6. The thermoelectric device 10 of FIG. 8 includes a plurality of alternating N-type semiconductor structures 12 and P-type semiconductor structures 12' arranged electrically in series and thermally in parallel. A N-type semiconductor structure 12 is attached to an adjacent P-type semiconductor structure 12' by an electrically (and thermally) conductive material (preferably plated copper as described above) 14 near the top 22 of each semiconductor structure 12, 12'. Similarly, the. N-type semiconductor structure 12 is attached to another adjacent P-type semiconductor structure 12' by another electrically (and thermally) conductive material (preferably copper as described above) 14 at the bottom 20 of each semiconductor structure 12, 12'. A DC voltage supply 18 is connected to the structure and a switch or relay may be provided as illustrated in FIG. 7 so that the polarity the may be altered to cause electrons to flow through the N-type semiconductor structures 12 in one direction or the other direction. Heat is pumped through each N-type semiconductor structure 12 in the direction of the electron flow. "Holes" in the P-type semiconductor structures 12' flow in one direction or the other thereby causing heat to be pumped through each P-type semiconductor structure 12 in the direction that the "holes" flow. The alternating pellets 12', 12 are sandwiched between ceramic substrates 30 to provide a thermoelectric device 10 or module. The ceramic substrates 30 may be attached to each other or to the alternating pellets 12', 12 using mechanical means or thermal adhesives.

Preferably the wafer transfer system 60 includes a robot arm 32 capable of moving in at least the x, y, z directions and capable of rotational movement. An end effector or wafer blade 34 is attached to the robot arm 32. The wafer blade 34 is constructed and arranged to support a semiconductor wafer thereon, and for heating or cooling the wafer between major semiconductor manufacturing process steps. The wafer blade 34 includes a base portion 36 that is attached to the robot arm 32. A ledge 38 is provided in the base portion 36 for supporting a thermoelectric device 10 along at least one peripheral edge thereof. An abutment wall 39 may be formed in the base portion 36 adjacent the ledge 38 for engaging a side 58 of the thermoelectric device 10. A pair of spaced apart side rails 42, 44 extend outwardly from the base portion 36 to provide an opening 37 therebetween. An end rail 45 bridges the two side rails 42, 44 and also includes a ledge 49 for supporting the thermoelectric device 10. An abutment 46 may be provided on any of the rails 42, 44 and/or 45 for engaging the sides 58 of the thermoelectric device 10. The abutment 46 may be slidably connected to the end rail 45 by a screw 47 so that the position of the abutment may be adjusted to clamp the abutment 46 more snugly against a side 58 of the thermoelectric device 10.

A DC voltage source 18 is provided in the wafer transfer system 60 so that direct current may flow through the thermoelectric device 10. Preferably the DC voltage source 18 is connected to electrical leads 40 which extend outwardly from the base portion 36 of the wafer blade 34. The electrical leads 40 may be electrically connected to the thermoelectric device 10 or may be connected to a power signal interconnect board 48 which in turn connects to the thermoelectric device 10. A central processing unit/controller 56 may be provided and connected to the DC voltage source 18 and to sensors (not shown) that measure the temperature of an upper surface 62 and/or lower surface 64 of the thermoelectric device 10. The central processing unit/controller 56 may be programmed to turn on the DC voltage source 18, or to switch (or cause a switch to be activated or moved) the direction of the current flow in response to input signals from temperature sensors located in the thermoelectric device 10 or sensors otherwise located to sense the temperature of the semiconductor wafer (not shown) that is supported by the wafer transfer system 60. Accordingly, the direction of the DC voltage current may be changed so that current flowing through the thermoelectric device 10 causes heat to be pumped from the upper surface 62 to the lower surface 64 in situations where the semiconductor wafer is to be cool by the thermoelectric device 10. Alternatively, the direction of the DC voltage current may be changed so that the current flowing through the thermoelectric device 10 causes heat to be pumped from the lower surface 64 to the upper surface 62 in situations where the semiconductor wafer is to be heated to by the thermoelectric device 10.

What is claimed is:

1. A semiconductor wafer transfer system comprising:
   a wafer blade and a thermoelectric device supported by the wafer blade, the thermoelectric device having an upper surface and a lower surface, and the thermoelectric device being constructed and arranged to pump heat from one of the surfaces to the other.

2. A semiconductor wafer transfer system comprising:
   a wafer blade and a thermoelectric device supported by the wafer blade, the thermoelectric device having an upper surface and a lower surface, and the thermoelectric device being constructed and arranged to pump heat from one of the surfaces to the other, the wafer blade includes a base portion and a pair of spaced apart side rails extending outwardly from the base portion, and the side rails being constructed and arranged to support the thermoelectric device.

3. A semiconductor wafer transfer system as set forth in claim 2 wherein the thermoelectric device includes a plurality of alternating N-type and P-type semiconductor structures connected together electrically in series and thermally in parallel.

4. A semiconductor wafer transfer system as set forth in claim 2 further comprising an end rail bridging the pair of spaced apart side rails, and the end rail having a ledge for supporting the thermoelectric device.

5. A semiconductor wafer transfer system as set forth in claim 4 wherein the thermoelectric device includes sides, and further comprising at least one abutment structure on the end rail constructed and arranged to engage a side of the thermoelectric device.

6. A semiconductor wafer transfer system as set forth in claim 5 wherein said abutment is attached to the end rail for slidable movement thereon and movable to a position to clamp against the thermoelectric device.

7. A semiconductor wafer transfer system as set forth in claim 4 wherein the thermoelectric device includes sides, and further comprising a pair of spaced apart abutment structures on the end rail, each abutment structure being constructed and arranged to engage a side of the thermoelectric device.

8. A semiconductor wafer transfer system as set forth in claim 2 wherein the wafer blade includes a base portion having a ledge formed therein for supporting a portion of the thermoelectric device, and the thermoelectric device further comprising sides, and the base portion having an abutment wall formed therein adjacent the ledge for engaging a side of the thermoelectric device.

9. A semiconductor wafer transfer system as set forth in claim 2 further comprising a DC voltage supply electrically connected to the thermoelectric device.

10. A semiconductor wafer transfer system as set forth in claim 9 further comprising a controller connected to the DC voltage supply to turn the current on and off, and to switch the polarity of the DC voltage supply in response to input signals from sensors in the thermoelectric device.

11. A semiconductor wafer transfer system as set forth in claim 9 further comprising a controller connected to the DC voltage supplies to switch the polarity of the DC voltage supply to the thermoelectric device thereby altering the flow direction of heat being pumped through the thermoelectric device.

12. A semiconductor wafer transfer system as set forth in claim 2 further comprising a heat shield connected to and extending between the side rails and underlying the thermoelectric device.

13. A semiconductor wafer transfer system as set forth in claim 2 wherein the wafer blade further comprises a base portion and electrical leads extending outwardly from the base portion for connection to the thermoelectric device.

14. A semiconductor wafer transfer system as set forth in claim 13 further comprising a DC voltage supply electrically connected to the electrical leads extending outwardly from the base portion.

15. A semiconductor wafer system as set forth in claim 2 wherein the thermoelectric device comprises a plurality of one of N-type and P-type semiconductor structures connected together electrically in series and thermally in parallel.

16. A semiconductor wafer transfer system as set forth in claim 2 wherein the thermoelectric device includes a plurality of alternating N-type and P-type semiconductor structures connected together electrically in series and thermally in parallel, and each N-type and P-type semiconductor structure having a top surface and a bottom surface, and further comprising an electrically and thermally conductive material connecting the top surfaces of a first pair of adjacent N-type and P-type semiconductor structures, and an electrically and thermally conductive material connecting the bottom surfaces of the second pair of adjacent N-type and P-type semiconductor structures so that the N-type and P-type structures are connected electrically in series.

17. A semiconductor wafer transfer system as set forth in claim 16 wherein the thermoelectric device further comprising a pair of ceramic substrates, and wherein said plurality of semiconductor structures are sandwiched between the ceramic substrates.

18. A semiconductor wafer transfer system as set forth in claim 2 further comprising a robot arm connected to the wafer blade, and wherein the robot arm is constructed and arranged for movement in at least the x, y and z directions.

19. A semiconductor wafer transfer system comprising:

a wafer blade and a thermoelectric device;

the thermoelectric device comprising a plurality of alternating N-type and P-type semiconductor structures electrically connected in series and thermally connected in parallel, each of the semiconductor structures having a top surface and a bottom surface, and the thermoelectric device being constructed and arranged so that direct current flowing through the thermoelectric device will cause heat to be pumped from the top surface to the bottom surface, or from the bottom surface to the top surface of each of the semiconductor structures depending on the direction of electron flow through the thermoelectric device;

the wafer blade comprising a base portion and a pair of spaced apart side rails extending therefrom, and wherein the thermoelectric device is supported by the side rails.

\* \* \* \* \*